United States Patent
Harrison

(10) Patent No.: US 6,535,032 B2
(45) Date of Patent: Mar. 18, 2003

(54) DATA RECEIVER TECHNOLOGY

(75) Inventor: Ronnie M. Harrison, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 09/843,313

(22) Filed: Apr. 25, 2001

(65) Prior Publication Data

US 2002/0180516 A1 Dec. 5, 2002

(51) Int. Cl.[7] .............................. H03K 5/22
(52) U.S. Cl. ........................... 327/66; 327/563
(58) Field of Search ............................. 327/52, 53, 65, 327/66, 77, 560–563; 323/315; 330/253

(56) References Cited

U.S. PATENT DOCUMENTS

| | | | |
|---|---|---|---|
| 5,568,073 A | * 10/1996 | McClure | ........................ 327/52 |
| 5,821,824 A | * 10/1998 | Mentzer | ........................ 327/52 |
| 5,994,939 A | * 11/1999 | Johnson et al. | ................ 327/65 |
| 6,151,648 A | 11/2000 | Haq | |
| 6,160,423 A | 12/2000 | Haq | |
| 6,188,339 B1 | * 2/2001 | Hasegawa | ................... 326/115 |
| 6,255,859 B1 | 7/2001 | Haq | |
| 6,327,205 B1 | 12/2001 | Haq | |

* cited by examiner

Primary Examiner—Toan Tran
(74) Attorney, Agent, or Firm—Leffert Jay & Polglaze, P.A.

(57) ABSTRACT

A data receiver circuit uses two parallel differential circuits to process incoming data signals. The parallel differential circuits each compare the data signal to a different clock signal. In one embodiment, the clock signals are complementary signals. Further, the parallel differential circuits are coupled to control a current mirror circuit such that an output of the data receiver is controlled in response to a differential transition between the data signal and one of the complementary clock signals. In one embodiment, a first differential circuit includes a transistor controlled by a CLK signal and a transistor controlled by the Data signal. The second differential circuit includes a transistor controlled by a /CLK signal (complement of CLK) and a transistor controlled by the Data signal.

34 Claims, 8 Drawing Sheets

DATA RECEIVER TECHNOLOGY

TECHNICAL FIELD OF THE INVENTION

The present invention relates generally to data receiver circuits.

BACKGROUND OF THE INVENTION

Data receiver circuitry is used to sample data signals communicated between electronic devices. Numerous data receiver techniques and circuits have been implemented to increase accuracy and data acquisition speed. One type of data receiver circuit samples incoming data on an active transition of a clock signal. Another type of receiver circuit samples the incoming data signal on both active and inactive transitions of the clock signal.

Referring to FIGS. 1 and 2, a prior art receiver circuit uses a pair of timing reference clocks in a point-to-point data communication system. The clock signals are complements of each other (CLK and /CLK). The receiver circuit uses two comparators (Comparator A and Comparator B) to compare the data signal with CLK and /CLK, respectively. Each comparator is a differential amplifier followed by a NAND gate. A receiver-enable signal drives a second input of the NAND gate. The outputs of both the comparators are connected to the receiver output through steering logic (consisting of two multiplexers with only one of the multiplexers being enabled at any given time). The steering logic determines which comparator should be connected to the output as shown in FIG. 2.

As depicted in FIG. 1, there are eight combinations of data input CLK and /CLK in the two consecutive bit times. In cases 1 and 6 the data input makes a differential comparison with CLK using Comparator A, in cases 2 and 5 the data input makes a differential comparison with /CLK using Comparator B, in the other four cases the data does not change. In case 1, the data and CLK both change, thus Comparator A still has full differential signal at the end of the first bit time. The steering logic is essentially an exclusive OR function between data and CLK. If both of them change, the same comparator remains connected to the data output through the enabled multiplexer for the next bit time. If the data does not change, the steering logic will disconnect the data output from the previous comparator and connect the other comparator to the data output. The steering logic essentially passes the output of Comparator A to the data output and keeps the enabled multiplexer connected to the output for the next bit time. The operation is similar for case 6 relative to Comparator A and CLK and to cases 2 and 5 using Comparator B and /CLK, since all these cases have a data input change relative to the previous bit time. When the data input does not change (as in case 3), the steering logic first disables the enabled multiplexer before the differential signal between the data input and CLK disappears on Comparator A and then enables the multiplexer connecting Comparator B to the data output. Since CLK and /CLK are complementary, by the end of the first bit time Comparator B has full differential signal, is driving the data output to the existing state, and is ready for the second bit time. The same CLKs can be used for multiple data inputs.

In case 1 (FIG. 1) data input goes from high to low and CLK goes from low to high, each of them swinging about 0.5 V. When they cross each other, the comparator (a differential amplifier followed by a NAND gate) detects the differential voltage very quickly. So in this case, the comparator started with a full differential signal of about 0.5 V with data input being higher than CLK and ended the bit time with the same difference, but CLK being higher than the data input. If the data input does NOT change, as shown in case 3 (FIG. 1), the CLK and data input become equal at a later time than they do in their crossing in case 1 and when the output of the Comparator A becomes a weak high or indeterminate in case 3.

FIG. 3 is a schematic diagram of the prior art receiver 100 of FIG. 2. Circuit 100 includes a receiver 102 to compare a Data signal 114 with a Clock signal 116. Receiver 102 provides an output 106 to multiplex circuit 120. Circuit 100 also includes a receiver 104 to compare Data signal 114 with a /Clock signal 116 (complementary Clock). Receiver 104 provides an output 108 to multiplex circuit 120. Multiplex circuit 120 routes a signal from either output connection 106 or 108 to multiplex output 122. The multiplex circuit is controlled in response to XNOR-A circuit 124 and XNOR-B circuit 126, as explained below. Output signals from the multiplex circuit are routed through output circuit 128 to an output connection 140. A clock receiver circuit 110 provides internal Clock 121 and/Clock 113 signals.

Table 1 and Table 2 illustrate the operation of XNOR-A circuit 124 and XNOR-B circuit 126, respectively. The B input has the same logic state as output 122 of the multiplex circuit 120, and the A input is its complement. XNOR-A 124 provides an output signal (OUT-A) on node 132. Likewise, XNOR-B 126 provides an output signal (OUT-B) on node 134. In operation, the data signal from node 106 is selected by multiplex circuit 120 when the signal on node 132 is low. Similarly, the data signal from node 108 is selected by multiplex circuit 120 when the signal on node 134 is low. Signals on nodes 132 and 134 are not low at the same time, see Tables 1 and 2. An enable signal is provided on connection 112 to enable receiver circuits 102, 104 and 110. The multiplex circuit 120 is also coupled to the enable signal.

TABLE 1

| A | B | CLK | OUT-A |
|---|---|-----|-------|
| 0 | 1 | 1   | 0     |
| 0 | 1 | 0   | 1     |
| 1 | 0 | 1   | 0     |
| 1 | 0 | 0   | 1     |

TABLE 2

| A | B | /CLK | OUT-B |
|---|---|------|-------|
| 0 | 1 | 1    | 0     |
| 0 | 1 | 0    | 1     |
| 1 | 0 | 1    | 0     |
| 1 | 0 | 0    | 1     |

The data receiver circuitry of FIG. 1 is complex and fails to provide repeatable data acquisition timing. For the reasons stated above, and for other reasons stated below which will become apparent to those skilled in the art upon reading and understanding the present specification, there is a need in the art for a simplified data receiver circuit.

SUMMARY OF THE INVENTION

The above-mentioned problems with data receiver circuits and other problems are addressed by the present invention and will be understood by reading and studying the following specification.

In one embodiment, a data receiver circuit comprises a first differential circuit comparing a first clock signal to a data signal, a second differential circuit comparing a second clock signal to the data signal, and a current mirror circuit coupled to the first and second comparator circuits. The first and second comparator circuits control an output of the current mirror circuit.

In another embodiment, a data receiver circuit includes a current mirror circuit comprising a first diode connected p-channel transistor having a gate coupled to its drain, a source of the first p-channel transistor is coupled to a voltage supply, and a second p-channel transistor having a gate coupled to the gate of the first p-channel transistor. A source of the second p-channel transistor is coupled to the voltage supply. The data receiver further includes a first differential circuit comprising a first n-channel transistor coupled between the drain of the first p-channel transistor and a first pull-down transistor. A gate of the first n-channel transistor is coupled to receive a first clock signal. The first differential circuit further comprises a second n-channel transistor coupled between a drain of the second p-channel transistor and the first pull-down transistor. A gate of the second n-channel transistor is coupled to receive a data signal. The data receiver further includes a second differential circuit comprising a third n-channel transistor coupled between the drain of the first p-channel transistor and a second pull-down transistor. A gate of the third n-channel transistor is coupled to receive a second clock signal. The second differential circuit further comprises a fourth n-channel transistor coupled between the drain of the second p-channel transistor and the second pull-down transistor. A gate of the fourth n-channel transistor is coupled to receive the data signal.

In yet another embodiment, an integrated circuit comprises a first input connection to receive a first clock signal, a second input connection to receive a second clock signal, a third input connection to receive a data signal, and data receiver circuit. The data receiver comprises a first differential circuit comparing the first clock signal to the data signal, a second differential circuit comparing the second clock signal to the data signal, and a current mirror circuit coupled to the first and second comparator circuits. The first and second comparator circuits control an output of the current mirror circuit.

A method of receiving incoming data is provided that comprises coupling a first clock signal and a data signal to a first differential circuit, coupling a second clock signal and the data signal to a second differential circuit, establishing an output signal in response to a current mirror circuit coupled to both the first and second differential circuits.

Another method of receiving incoming data comprises coupling a first clock signal and a data signal to a first differential circuit, and coupling a second clock signal and the data signal to a second differential circuit. Wherein the first and second differential circuits are coupled to a current mirror circuit to provide an output signal. The method includes generating the output signal in response to the first differential circuit when the first clock signal and the data signal transition in opposite directions, or generating the output signal in response to the second differential circuit when the second clock signal and the data signal transition in opposite directions.

DETAILED DESCRIPTION OF THE INVENTION

Figure 1:
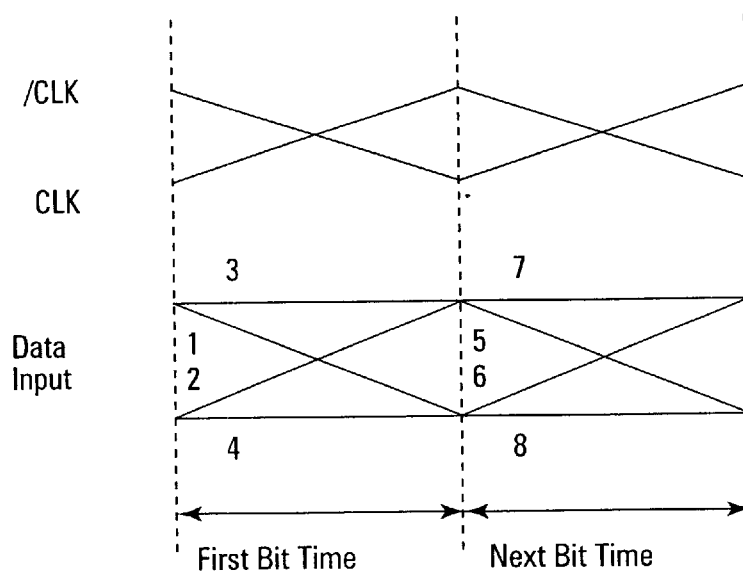
FIG. 1 illustrates operation of a prior art receiver circuit.
Figure 2:
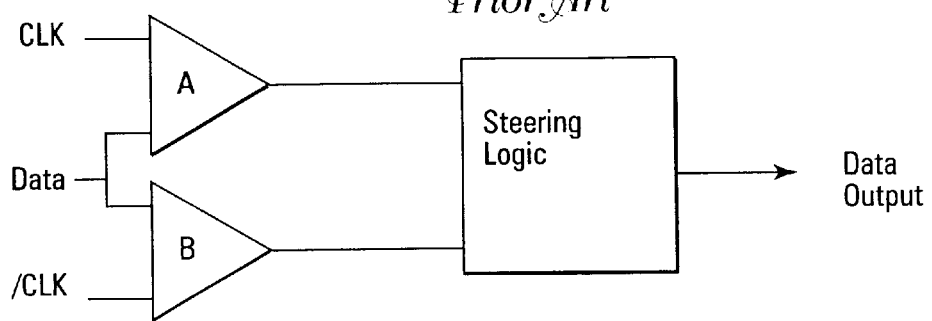
FIG. 2 is a block diagram of a prior art data receiver of FIG. 1.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

As explained above, data receiver circuitry is used to recover data in a communication system. The data can be transmitted with one or more clock signals. An embodiment of the present invention recovers data by comparing received data signals to complementary clock signals. Referring to FIG. 4, a schematic diagram of a receiver circuit 200 of an embodiment of the present invention is described. The receiver circuitry is substantially simplified from circuit 100 of FIG. 3. As explained below, receiver 200 also provides improved performance over circuit 100.

Receiver 200 includes a CLK receiver circuit 208 to provide an internal CLK signal on node 250. The internal CLK signal is generated in response to a CLK signal provided on node 202 and a complement clock signal, /CLK, provided on node 204. In operation, the CLK receiver is enabled in response to Enable signal provided on node 206. The Enable signal activates transistor 244 and turns-off transistor 246. If the /CLK signal is high, transistor 238 pulls node 248 low. The CLK signal is low at this time and turns off transistor 236. As such, the output signal on node 250 is low. When the CLK signal is high, transistor 236 is turned on and establishes a current through transistor 240. This current is mirrored in transistor 242 to pull node 248 high. The /CLK signal is low at this time and turns off transistor 238. As such, the output signal on node 250 is high. Thus, the signal on node 250 follows the CLK signal.

Receiver 200 includes a /clock receiver circuit 210 to provide an internal /clock signal on node 234. The internal /clock signal is generated in response to CLK signal provided on node 202 and complement clock signal, /CLK, provided on node 204. In operation, the /clock receiver is enabled in response to the Enable signal provided on node 206. The Enable signal activates transistor 230 and turns-off transistor 228. If the CLK signal is high, transistor 222 pulls node 232 low. The /CLK signal is low at this time and turns off transistor 220. As such, the output signal on node 234 is low. When the /CLK signal is high, transistor 220 is turned on and establishes a current through transistor 224. This current is mirrored in transistor 226 to pull node 232 high. The CLK signal is low at this time and turns off transistor 222. As such, the output signal on node 234 is high. Thus, the signal on node 234 follows the /CLK signal. Nodes 234 and 250 are coupled to output circuit 212, as explained below.

It will be appreciated by those skilled in the art with the benefit of the present description that the present invention is not limited to the specific CLK and /CLK receiver circuits described. Each circuit is provided to generate an output signal that has full power rail levels. That is, the incoming CLK and /CLK signals have peak values that are less than the power supply levels of Vcc and Vss. Further, the complementary clock signals can be generated using an inverter circuit. This embodiment eliminates one of the receiver circuits, however, the inverter circuit creates some skew between the internal clock signals.

A data receiver 270 is provided in the circuit of FIG. 4. The data receiver has an input node 271 to receive Data. The data receiver is also coupled to nodes 202, 204 and 206 to receive the CLK, /CLK and Enable signals, respectively. The receiver "compares" the Data signal to both the CLK and /CLK signals, and provides an output signal on node 292. In operation, the Enable signal activates transistors 272 and 274, and turns-off transistor 276.

The data receiver includes a diode connected p-channel transistor 286 coupled as a current mirror with p-channel transistor 288. The receiver has two differential circuits. The first differential circuit includes transistors 278 and 280. These transistors are coupled to pull-down transistor 272. In operation, transistors 278 and 280 balance a pull-down current of transistor 272 between nodes 300 and 302. The second differential circuit includes transistors 282 and 284. These transistors are coupled to pull-down transistor 274. In operation, transistors 282 and 284 balance a pull-down current of transistor 274 between nodes 300 and 302.

Figure 5:
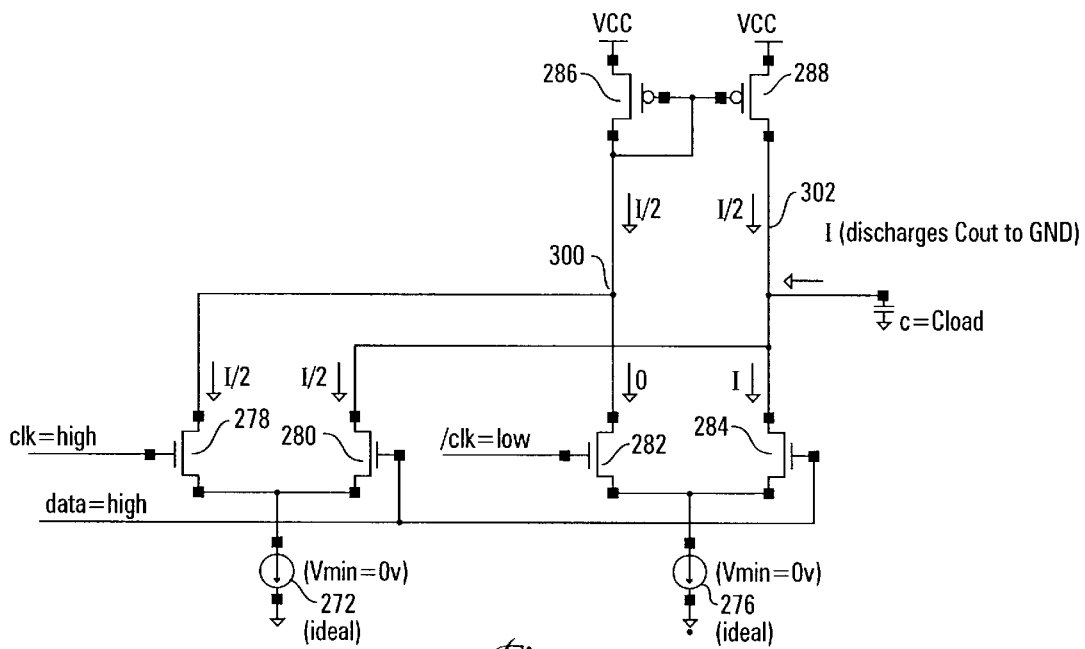
FIG. 5 illustrates an operating state of a portion of the receiver circuit of FIG. 4 with current sources.
Figure 6:
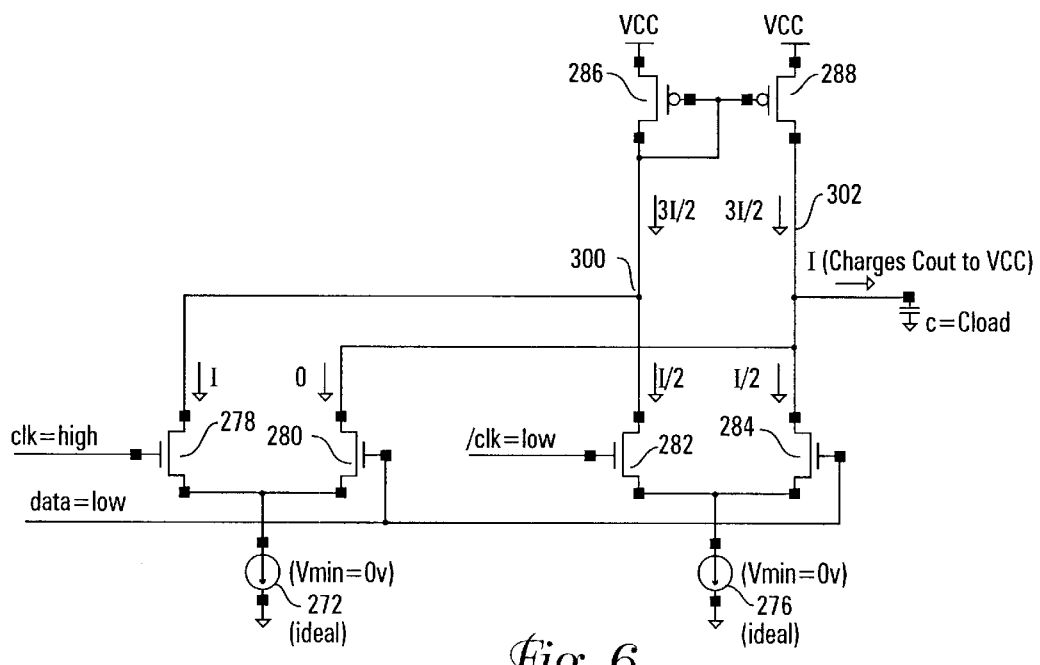
FIG. 6 illustrates another operating state of a portion of the receiver circuit of FIG. 4 with current sources.

To better understand the operation of the receiver circuit, the circuit is illustrated in FIGS. 5 and 6 using ideal current sources in place of transistors 272 and 274. The ideal current sources have outputs cannot go below zero volts. It is noted that the transistors are not true current sources, but are reasonable approximations for analysis purposes. The input voltage levels are always substantially above the threshold voltages of the N-channel differential transistors. Thus, the differential transistors never cut off due to the absolute input voltage, but only if its gate voltage is lower than that of the other transistor in a differential pair. In operation it is a requirement that the Data signals transition simultaneously with the clock transitions. Since the two differential pairs (278–280 and 282–284) have their outputs connected in parallel, they are identical except for the phase of the clock input. Every time the clock makes a transition, the transistor pairs swap roles. This reduces the number of operating states that need to be examined from 8 (as in FIG. 1) to 4.

If both inputs to a differential pair are of the same level (both high or both low), the transistors in the pair share the tail current I equally, each conducting I/2. The current in the left-side transistor (278 or 282) of the pair gets "turned around" by the current mirror transistor pair 286 and 288. The resulting current in transistor 288 cancels the current in the right-side transistor (280 or 284) of the pair. In the case where both inputs of a differential pair are at the same voltage, each transistor contributes nothing to the output voltage at node 302. Since it matters not whether both inputs are high or both are low, the number of cases that need to be examined is two.

Referring to FIG. 5, the input data signal is high. In this operational case, one pair of differential transistors is contributing nothing to the output voltage. The other differential pair is conducting current (I) through the right-side transistor of one of the differential pair to pull node 302 to zero volts. Specifically, when Clock is high, transistors 278 and 280 each conduct I/2. The current through transistor 278 is mirrored through transistor 286 to transistor 288. Output node 302, therefore, is sourced a current of I/2. With /Clock low, transistor 282 is not conducting current and transistor 284 is sinking current I from node 302. As such, output 302 is sourced I/2 and sinks 3I/2. Output 302, therefore, is discharged with a current of I. When the Clock and /Clock signals transition, the roles of the differential pairs switch but output 302 remains discharged by I.

When the Data signal is low, the operation is slightly more complex. That is, the right-side transistor of one or the other of the differential pairs is turned off, while one or the other of the left-side (clock-driven) transistors is turned on. Referring to FIG. 6, transistor 278 conducts current I and transistor 280 is turned off. Each transistor of the other pair, 282 and 284, conduct I/2. As such, transistors 286 and 288 each conduct 3I/2. As such, output 302 is sourced a current of I and pulls node 302 to VCC.

If Data changes levels, node 302 changes levels such that the output voltage is an inverted and amplified version of Data. Because the Data signal transitions occur simultaneously with clock transitions, the differential pair whose inputs are transitioning in opposite directions sees a quasi-differential signal. This provides most of the benefits of a fully differential receiver (twice the small-signal gain of a single-ended receiver, absence of reference offset and noise problems), while requiring only a single-ended Data signal. Finally, the clock, while differential, may be shared among multiple Data receivers.

Figure 7:
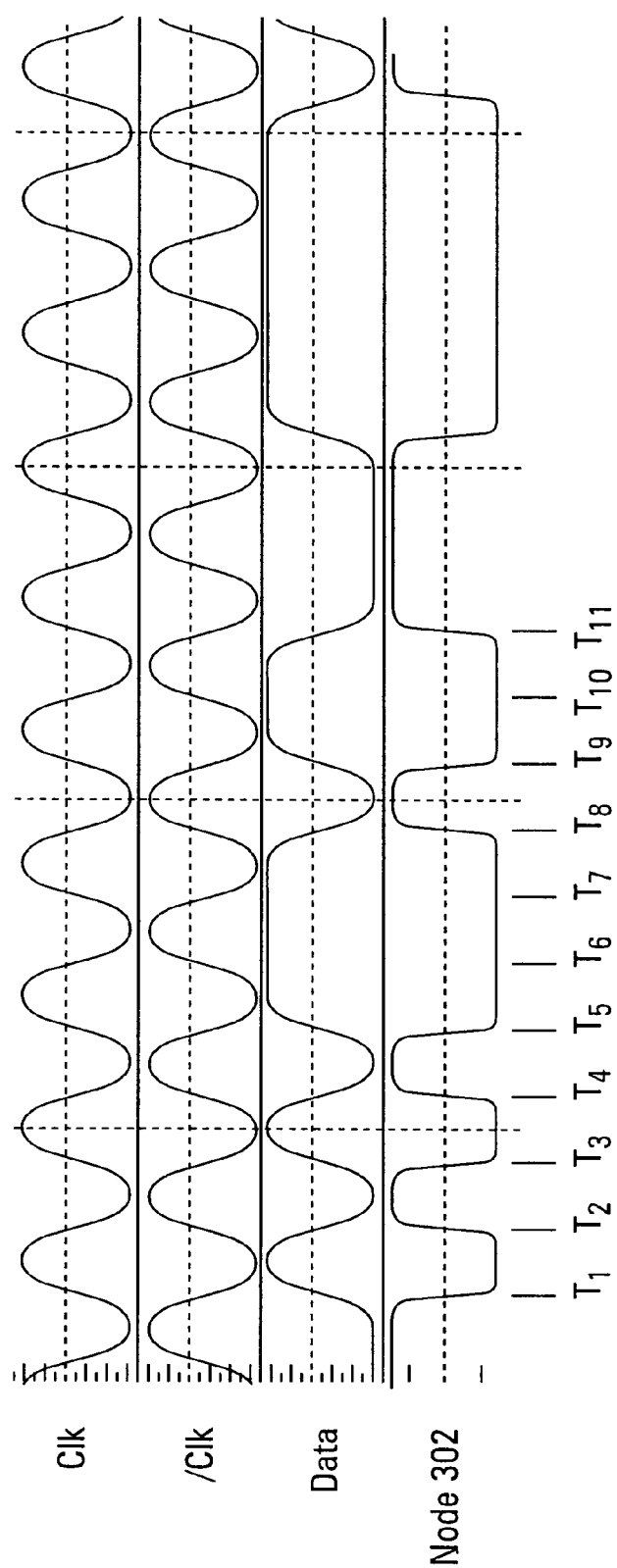
FIG. 7 is a timing diagram of the data receiver of FIG. 4.

Referring to FIG. 7, a timing diagram of the data receiver of FIG. 4 is illustrated. CLK and /CLK are complementary analog sinusoidal signals transitioning between about 700 mv and 1.2 v. These signals are converted to digital signals having full power rail levels by receiver circuits 208 and 210, as explained above. An incoming analog data signal is also illustrated. The Data signal also transitions between about 700 mv and 1.2 v. The receiver signal at node 302 is illustrated. Note that the signal of node 302 is complementary to the incoming data signal. During operation, at time T1 the Data signal and CLK are both transitioning high. As such, transistors 278 and 280 offset each other and don't change node 302. The /CLK and Data signals transition in opposite directions. Thus, the gate voltage of transistor 282 decreases while the gate voltage of transistor 284 is increased. This differential drives the voltage at node 302 low. Data and /CLK remain in a differential state through time T5.

At time T6, the Data signal does not change states, but remains high. As such, transistors 280 and 284 remain active and pull node 302 low while the CLK and /CLK signal transition. At time T11, the CLK and Data signals are no longer in common mode. That is, the CLK signal transitions high while the Data signal transitions low. Transistors 282 and 284 offset each other and don't change node 302. Because the CLK and Data signals transition in opposite directions, the gate voltage of transistor 278 increases while the gate voltage of transistor 280 decreases. This differential drives the voltage at node 302 high.

Node 292 is coupled to output circuit 212. Output circuit 212 includes first and second flip-flop circuits 260 and 262. The flip-flops are reverse coupled such that flip-flop 260 latched data in response to /CLK and flip-flop 262 latches data in response to CLK. The outputs of the flip-flop circuits are routed through multiplex circuit 264 to provide output data on node 268 via inverter 266. The output circuit provides data on both edges of the CLK signal. This configuration is commonly referred to as a double data rate (DDR) circuit. It will be appreciated by those skilled in the art that other output circuits can be provided and the present invention is not limited to the DDR circuit illustrated.

Figure 3:
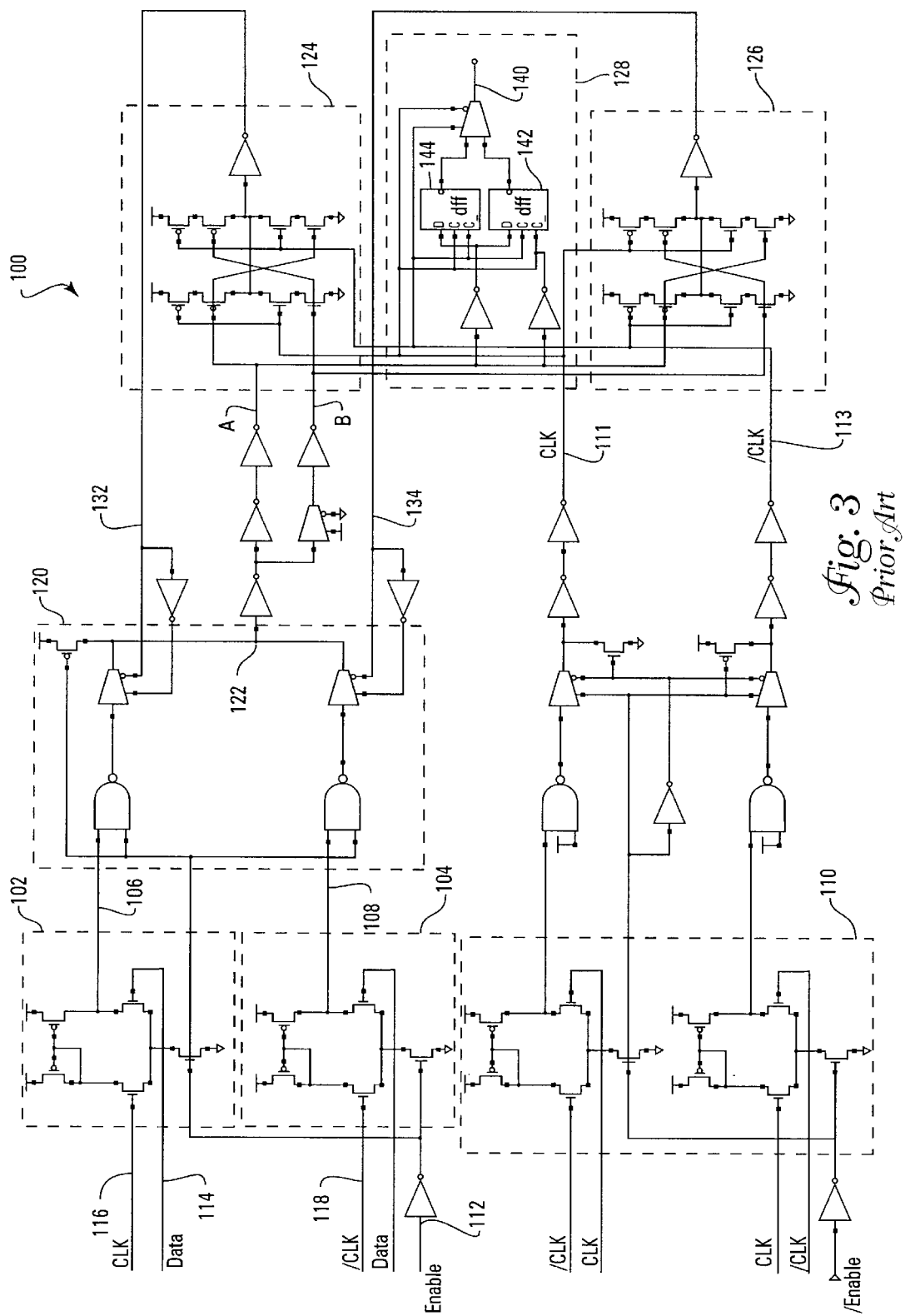
FIG. 3 is a schematic diagram of the prior art data receiver of FIG. 2.
Figure 4:
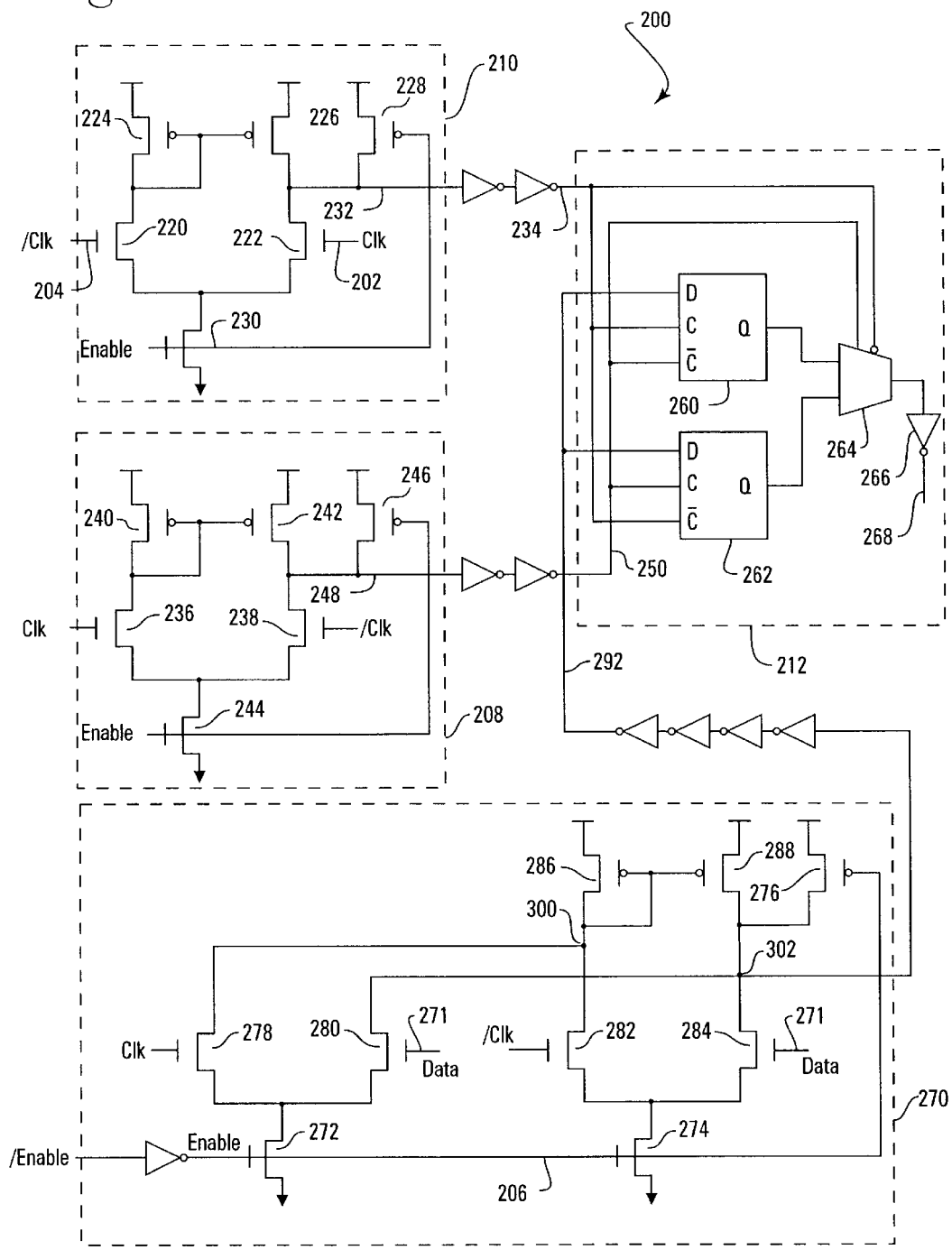
FIG. 4 is a schematic diagram of a receiver circuit of an embodiment of the present invention.
Figure 8:
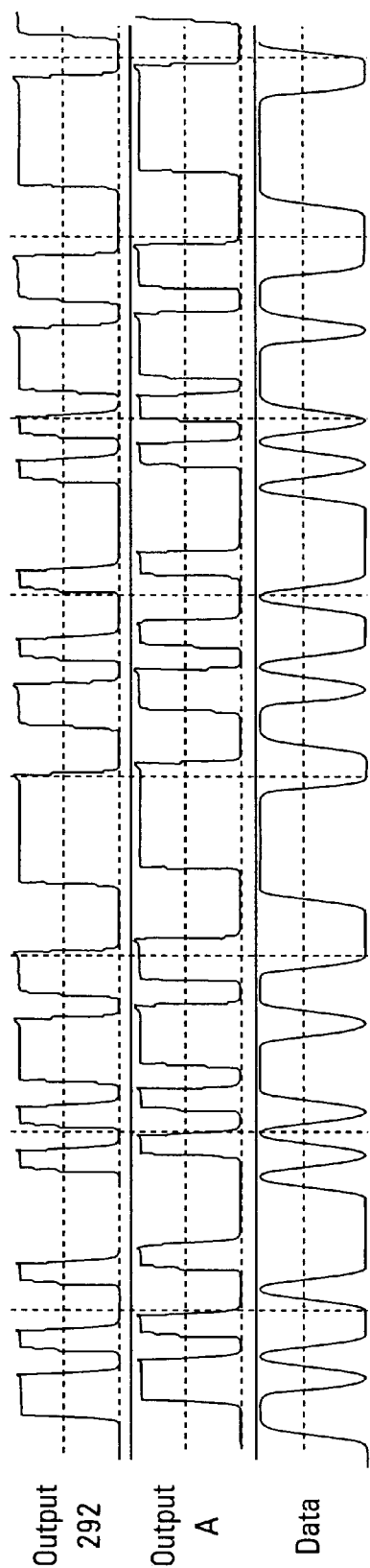
FIG. 8 is a timing diagram comparing operation of the data receivers of FIGS. 3 and 4.

FIG. 8 illustrates a timing diagram comparing operation of the data receivers of FIGS. 3 and 4. A common input Data signal is illustrated that is processed by both receiver 100 of the prior art, and receiver 200. The output signal of receiver 200 (node 292) and the output signal of circuit 100 (node A) are both illustrated. Both circuits provide substantially the same digital output signal in response to the input analog Data signal. It is noted that the output of circuit 200 more closely corresponds to the Data input signal than the output from circuit 100. That is, the response time of circuit 200 is faster than circuit 100.

An important diagnostic technique used in evaluating performance of a communication system is an eye pattern, or eye diagram. The eye diagram is a synchronized superposition of all possible realizations of a signal of interest viewed within a particular signaling interval. The eye diagram can be recorded by superimposing multiple sweeps in a storage oscilloscope. The eye pattern provides information about the performance of a data transmission system. For example, the width of the eye opening defines a time interval over which a received signal can be sampled without error from inter-symbol interference. The optimum sampling time is where the eye is open the widest. When inter-symbol interference is severe, the upper traces cross the lower traces resulting in a closed eye. In such a situation it is impossible to avoid errors.

Figure 9:
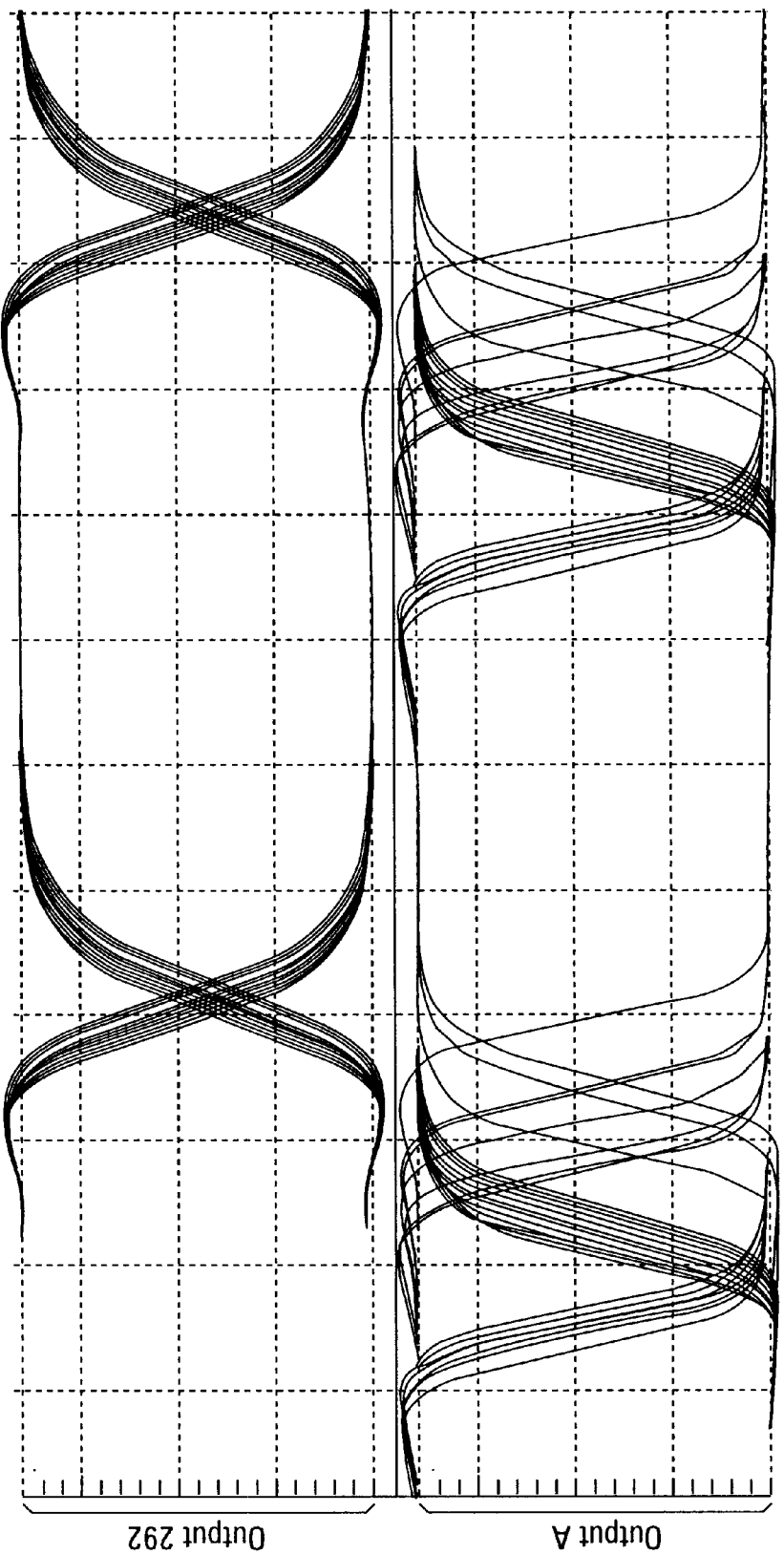
FIG. 9 illustrates data acquisition repeatability of the data receivers of FIGS. 3 and 4.

A sample eye diagram of the output transitions of receiver 270 and receiver circuitry 102, 104 and 120 are illustrated in FIG. 9. It is noted that the eye opening of the output of circuit 270 is wider than the opening of data from circuitry 102, 104 and 120. As such, circuit 200 provides a better opportunity to latch output data without error.

Figure 10:
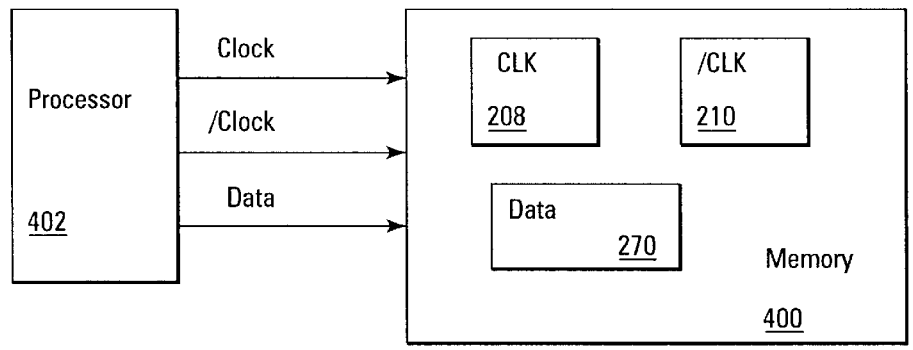
FIG. 10 illustrates a communication system of an embodiment of the present invention.

FIG. 10 is a simplified block diagram of a communication system of an embodiment of the present invention. The system includes an integrated circuit 400, such as a memory device, coupled to an external circuit 402. The external circuit can be a processor, or other communication device. The integrated circuit includes a data receiver 270 coupled to process incoming data signals. As explained above, the integrated circuit can also include clock receiver circuitry 208 and 210.

CONCLUSION

A data receiver circuit has been described that uses two parallel differential circuits to process incoming data signals. The parallel differential circuits each compare the data signal to a different clock signal. In one embodiment, the clock signals are complementary signals. Further, the parallel differential circuits are coupled to control a current mirror circuit such that an output of the data receiver is controlled in response to a differential transition between the data signal and one of the complementary clock signals. In one embodiment, a first differential circuit includes a transistor controlled by a CLK signal and a transistor controlled by the Data signal. The second differential circuit includes a transistor controlled by a /CLK signal (complement of CLK) and a transistor controlled by the Data signal.

Figure 11:
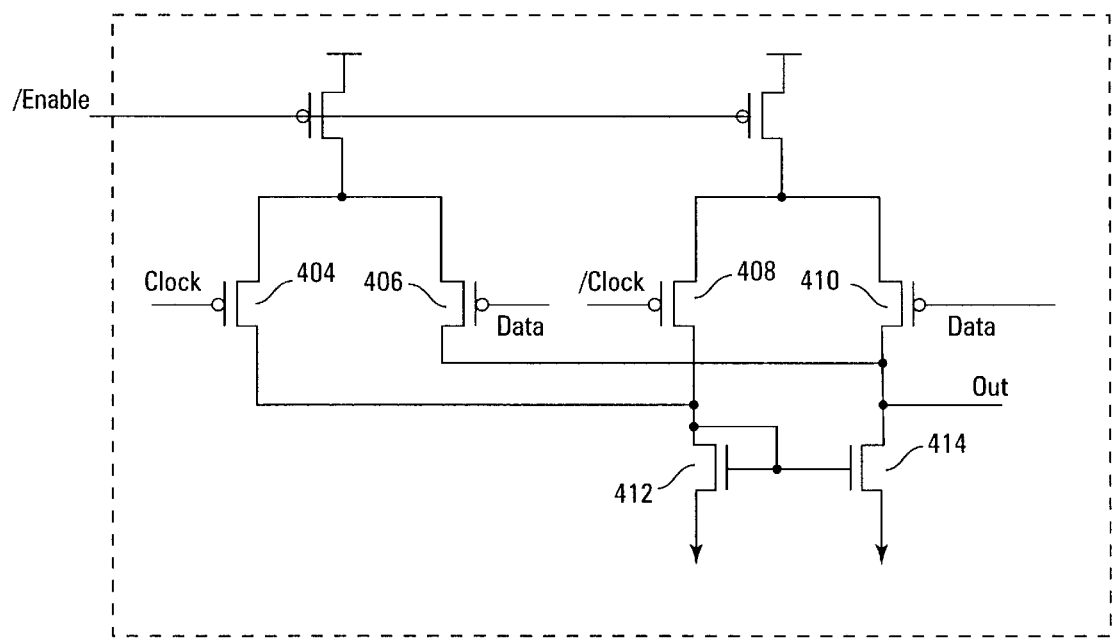
FIG. 11 illustrates a circuit with differential transistors fabricated as P-channel transistors.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. For example, the differential transistors can be fabricated as P-channel transistors 404, 406, 408 and 410 with an N-channel transistor based current mirror 412 and 414, see FIG. 11. Therefore, it is manifestly intended that this invention be limited only by the claims and the equivalents thereof.

What is claimed is:

1. A data receiver circuit comprising:
   a first differential circuit comparing a first clock signal to a data signal;
   a second differential circuit comparing a second clock signal to the data signal; and
   a current mirror circuit coupled to the first and second comparator circuits, wherein an output of the current mirror circuit is controlled by the first and second comparator circuits.

2. The data receiver circuit of claim 1 wherein the second clock signal is complementary of the first clock signal.

3. The receiver circuit of claim 1 wherein the current mirror comprises:
   a first diode connected p-channel transistor coupled to first nodes of the first and second comparator circuits; and
   a second p-channel transistor having a gate coupled to a gate of the first p-channel transistor, the second p-channel transistor is coupled to second nodes of the first and second comparator circuits.

4. The receiver circuit of claim 3 wherein the first differential circuit comprises:
   a first n-channel transistor coupled between the first node of the first differential circuit and a pull-down transistor, a gate of the first n-channel transistor is coupled to receive the first clock signal; and
   a second n-channel transistor coupled between the second node of the first differential circuit and the pull-down transistor, a gate of the second n-channel transistor is coupled to receive the data signal.

5. The receiver circuit of claim 3 wherein the second differential circuit comprises:
   a first n-channel transistor coupled between the first node of the second differential circuit and a pull-down transistor, a gate of the first n-channel transistor is coupled to receive the second clock signal; and
   a second n-channel transistor coupled between the second node of the second differential circuit and the pull-down transistor, a gate of the second n-channel transistor is coupled to receive the data signal.

6. The receiver circuit of claim 1 wherein the current mirror comprises:
   a first diode connected n-channel transistor coupled to first nodes of the first and second comparator circuits; and
   a second n-channel transistor having a gate coupled to a gate of the first n-channel transistor, the second n-channel transistor is coupled to second nodes of the first and second comparator circuits.

7. The receiver circuit of claim 6 wherein the first differential circuit comprises:
a first p-channel transistor coupled between the first node of the first differential circuit and a pull-down transistor, a gate of the first p-channel transistor is coupled to receive the first clock signal; and
a second p-channel transistor coupled between the second node of the first differential circuit and the pull-down transistor, a gate of the second p-channel transistor is coupled to receive the data signal.

8. The receiver circuit of claim 6 wherein the second differential circuit comprises:
a first p-channel transistor coupled between the first node of the second differential circuit and a pull-down transistor, a gate of the first p-channel transistor is coupled to receive the second clock signal; and
a second p-channel transistor coupled between the second node of the second differential circuit and the pull-down transistor, a gate of the second p-channel transistor is coupled to receive the data signal.

9. A data receiver circuit comprising:
a current mirror circuit comprising a first diode connected p-channel transistor having a gate coupled to its drain, a source of the first p-channel transistor is coupled to a voltage supply, and a second p-channel transistor having a gate coupled to the gate of the first p-channel transistor, a source of the second p-channel transistor is coupled to the voltage supply;
a first differential circuit comprising,
a first n-channel transistor coupled between the drain of the first p-channel transistor and a first pull-down transistor, a gate of the first n-channel transistor is coupled to receive a first clock signal, and
a second n-channel transistor coupled between a drain of the second p-channel transistor and the first pull-down transistor, a gate of the second n-channel transistor is coupled to receive a data signal; and
a second differential circuit comprising,
a third n-channel transistor coupled between the drain of the first p-channel transistor and a second pull-down transistor, a gate of the third n-channel transistor is coupled to receive a second clock signal, and
a fourth n-channel transistor coupled between the drain of the second p-channel transistor and the second pull-down transistor, a gate of the fourth n-channel transistor is coupled to receive the data signal.

10. The data receiver circuit of claim 9 further comprising:
an output circuit coupled to latch a voltage signal at the drain of the second p-channel transistor.

11. The data receiver circuit of claim 10 wherein the output circuit latches the voltage signal on all state transitions of the first clock signal.

12. The data receiver circuit of claim 9 wherein the second clock signal a complement of the first clock signal.

13. The data receiver circuit of claim 9 further comprises a clock receiver coupled to receive the first and second clock signals and provide an output clock signal that follows the first clock signal and transitions between full power supply rails.

14. The data receiver circuit of claim 9 further comprises a clock receiver coupled to receive the first and second clock signals and provide an output clock signal that follows the second clock signal and transitions between full power supply rails.

15. A data receiver circuit comprising:
a current mirror circuit comprising a first diode connected n-channel transistor having a gate coupled to its drain, the drain of the first n-channel transistor is coupled to a voltage supply, and a second n-channel transistor having a gate coupled to the gate of the first n-channel transistor, a drain of the second n-channel transistor is coupled to the voltage supply;
a first differential circuit comprising,
a first p-channel transistor coupled between the source of the first n-channel transistor and a first pull-down transistor, a gate of the first p-channel transistor is coupled to receive a first clock signal, and
a second p-channel transistor coupled between a source of the second n-channel transistor and the first pull-down transistor, a gate of the second p-channel transistor is coupled to receive a data signal; and
a second differential circuit comprising,
a third p-channel transistor coupled between the source of the first n-channel transistor and a second pull-down transistor, a gate of the third p-channel transistor is coupled to receive a second clock signal, and
a fourth p-channel transistor coupled between the source of the second n-channel transistor and the second pull-down transistor, a gate of the fourth p-channel transistor is coupled to receive the data signal.

16. An integrated circuit comprising:
a first input connection to receive a first clock signal;
a second input connection to receive a second clock signal;
a third input connection to receive a data signal; and
data receiver circuit comprising,
a first differential circuit comparing the first clock signal to the data signal,
a second differential circuit comparing the second clock signal to the data signal, and
a current mirror circuit coupled to the first and second comparator circuits, wherein an output of the current mirror circuit is controlled by the first and second comparator circuits.

17. An integrated circuit comprising:
a first input connection to receive a first clock signal;
a second input connection to receive a second clock signal;
a third input connection to receive a data signal; and
data receiver circuit comprising,
a current mirror circuit comprising a first diode connected p-channel transistor having a gate coupled to its drain, a source of the first p-channel transistor is coupled to a voltage supply, and a second p-channel transistor having a gate coupled to the gate of the first p-channel transistor, a source of the second p-channel transistor is coupled to the voltage supply;
a first differential circuit comprising,
a first n-channel transistor coupled between the drain of the first p-channel transistor and a first pull-down transistor, a gate of the first n-channel transistor is coupled to receive the first clock signal, and
a second n-channel transistor coupled between a drain of the second p-channel transistor and the first pull-down transistor, a gate of the second n-channel transistor is coupled to receive the data signal; and
a second differential circuit comprising,
a third n-channel transistor coupled between the drain of the first p-channel transistor and a second pull-down transistor, a gate of the third n-channel transistor is coupled to receive the second clock signal, and a fourth n-channel transistor coupled between the drain of the second p-channel transistor and the second pull-down transistor, a gate of the fourth n-channel transistor is coupled to receive the data signal.

18. The integrated circuit of claim 17 wherein the first and second pull-down transistors are selectively activated by an enable signal.

19. The integrated circuit of claim 17 further comprising a clock receiver coupled to receive the first and second clock signals and provide an output clock signal that follows the first clock signal and transitions between full power supply rails.

20. The integrated circuit of claim 17 further comprising a clock receiver coupled to receive the first and second clock signals and provide an output clock signal that follows the second clock signal and transitions between full power supply rails.

21. The integrated circuit of claim 17 further comprising an output circuit coupled to latch a voltage signal at the drain of the second p-channel transistor.

22. The integrated circuit of claim 21 wherein the output circuit latches the voltage signal on all state transitions of the first clock signal.

23. The integrated circuit of claim 17 wherein the integrated circuit is a memory device.

24. A method of receiving incoming data comprising:
coupling a first clock signal and a data signal to a first differential circuit;
coupling a second clock signal and the data signal to a second differential circuit;
establishing an output signal in response to a current mirror circuit coupled to both the first and second differential circuits.

25. The method of claim 24 wherein the output signal is controlled by the first differential circuit when the first clock signal and the data signal transition in opposite directions.

26. The method of claim 24 wherein the output signal is controlled by the second differential circuit when the second clock signal and the data signal transition in opposite directions.

27. A method of receiving incoming data comprising:
coupling a first clock signal and a data signal to a first differential circuit;
coupling a second clock signal and the data signal to a second differential circuit, wherein the first and second differential circuits are coupled to a current mirror circuit to provide an output signal; and
generating the output signal in response to the first differential circuit when the first clock signal and the data signal transition in opposite directions, or generating the output signal in response to the second differential circuit when the second clock signal and the data signal transition in opposite directions.

28. A memory device comprising:
a first input connection to receive a first clock signal;
a second input connection to receive a second clock signal;
a third input connection to receive a data signal; and
data receiver circuit comprising,
a first differential circuit comparing the first clock signal to the data signal,
a second differential circuit comparing the second clock signal to the data signal, and
a current mirror circuit coupled to the first and second comparator circuits, wherein an output of the current mirror circuit is controlled by the first and second comparator circuits.

29. A memory device comprising:
a first input connection to receive a first clock signal;
a second input connection to receive a second clock signal, wherein the second clock signal is s complement of the first clock signal;
a third input connection to receive a data signal; and
data receiver circuit comprising,
a current mirror circuit comprising a first diode connected p-channel transistor having a gate coupled to its drain, a source of the first p-channel transistor is coupled to a voltage supply, and a second p-channel transistor having a gate coupled to the gate of the first p-channel transistor, a source of the second p-channel transistor is coupled to the voltage supply;
a first differential circuit comprising,
a first n-channel transistor coupled between the drain of the first p-channel transistor and a first pull-down transistor, a gate of the first n-channel transistor is coupled to receive the first clock signal, and
a second n-channel transistor coupled between a drain of the second p-channel transistor and the first pull-down transistor, a gate of the second n-channel transistor is coupled to receive the data signal; and
a second differential circuit comprising,
a third n-channel transistor coupled between the drain of the first p-channel transistor and a second pull-down transistor, a gate of the third n-channel transistor is coupled to receive the second clock signal, and
a fourth n-channel transistor coupled between the drain of the second p-channel transistor and the second pull-down transistor, a gate of the fourth n-channel transistor is coupled to receive the data signal.

30. A memory system comprising:
a processor; and
a memory device coupled to the processor comprising,
a first input connection to receive a first clock signal,
a second input connection to receive a second clock signal,
a third input connection to receive a data signal, and
data receiver circuit comprising,
a first differential circuit comparing the first clock signal to the data signal,
a second differential circuit comparing the second clock signal to the data signal, and
a current mirror circuit coupled to the first and second comparator circuits, wherein an output of the current mirror circuit is controlled by the first and second comparator circuits.

31. The memory system of claim 30 wherein the second clock signal is complementary of the first clock signal.

32. The memory system of claim 30 wherein the current mirror comprises:
a first diode connected p-channel transistor coupled to first nodes of the first and second comparator circuits; and
a second p-channel transistor having a gate coupled to a gate of the first p-channel transistor, the second p-channel transistor is coupled to second nodes of the first and second comparator circuits.

33. The memory system of claim 32 wherein the first differential circuit comprises:

a first n-channel transistor coupled between the first node of the first differential circuit and a pull-down transistor, a gate of the first n-channel transistor is coupled to receive the first clock signal; and a second n-channel transistor coupled between the second node of the first differential circuit and the pull-down transistor, a gate of the second n-channel transistor is coupled to receive the data signal.

34. The memory system of claim 32 wherein the second differential circuit comprises:

a first n-channel transistor coupled between the first node of the second differential circuit and a pull-down transistor, a gate of the first n-channel transistor is coupled to receive the second clock signal; and a second n-channel transistor coupled between the second node of the second differential circuit and the pull-down transistor, a gate of the second n-channel transistor is coupled to receive the data signal.

* * * * *